United States Patent
Beeman et al.

(10) Patent No.: US 6,576,977 B1
(45) Date of Patent: Jun. 10, 2003

(54) LOW COST BIAS TECHNIQUE FOR DUAL PLATE INTEGRATED CAPACITORS

(75) Inventors: Donald St. John Beeman, Penn Valley, NV (US); Paul M. Werking, Auburn, NV (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 10/245,022

(22) Filed: Sep. 17, 2002

(51) Int. Cl.$^7$ .................. H01L 29/76; H01L 29/94; H01L 31/062; H01L 31/113; H01L 31/119
(52) U.S. Cl. .................. 257/533; 257/303; 257/306; 257/379; 257/381; 257/532
(58) Field of Search ................... 257/296, 300, 257/298, 303, 306, 379, 381, 533, 385, 386

(56) References Cited

U.S. PATENT DOCUMENTS

| | | | | |
|---|---|---|---|---|
| 4,829,350 A | * | 5/1989 | Miller ................ | 357/23.13 |
| 5,005,102 A | | 4/1991 | Larson ................ | 361/313 |
| 5,298,782 A | * | 3/1994 | Sundaresan ........... | 257/393 |
| 5,382,819 A | * | 1/1995 | Honjo ................. | 257/371 |
| 5,760,474 A | | 6/1998 | Schuele ............... | 257/754 |
| 5,907,462 A | * | 5/1999 | Chatterjee et al. ..... | 361/56 |
| 5,963,805 A | | 10/1999 | Kang et al. ........... | 438/255 |
| 6,171,970 B1 | | 1/2001 | Xing et al. ........... | 438/706 |
| 6,177,309 B1 | | 1/2001 | Lee ................... | 438/253 |
| 6,218,260 B1 | | 4/2001 | Lee et al. ............ | 438/398 |
| 6,261,917 B1 | | 7/2001 | Quek et al. ........... | 438/396 |
| 6,268,620 B1 | | 7/2001 | Quellet et al. ........ | 257/301 |
| 6,300,215 B1 | | 10/2001 | Shin .................. | 438/396 |
| 2002/0195661 A1 | * | 12/2002 | Ueda ................. | 257/347 |

* cited by examiner

*Primary Examiner*—Eddie Lee
*Assistant Examiner*—Jesse A. Fenty
(74) *Attorney, Agent, or Firm*—Stallman & Pollock LLP

(57) ABSTRACT

An integrated dual-plate capacitor structure incorporates a small MOS transistor to reduce die area. The capacitor structure includes a semiconductor substrate having a first conductivity type and having a well region having a second conductivity type opposite the first conductivity type formed therein. An upper conductive plate and a lower conductive plate separated by a first layer of dielectric material are formed over the well region. The lower capacitor plate is separated from the upper surface of the well region by a second layer of dielectric material. A MOS transistor is formed in the semiconductor substrate. The MOS transistor includes space-apart source and drain regions of the second conductivity type that define a substrate channel region therebetween. A conductive gate is formed above the channel region and is separated therefrom by a layer of intervening dielectric material. The source region and the gate of the MOS transistor are connected to receive a bias voltage. The drain region of the MOS transistor is electrically connected to the well region. In an alternative embodiment, the drain of the MOS transistor is incorporated into the well region of the capacitor structure.

12 Claims, 3 Drawing Sheets

LOW COST BIAS TECHNIQUE FOR DUAL PLATE INTEGRATED CAPACITORS

TECHNICAL FIELD

The present invention relates to components of semiconductor integrated circuits and, in particular, to the utilization of a small transistor to provide a high impedance device for biasing the well under a dual plate integrated capacitor.

BACKGROUND OF THE INVENTION

Capacitors are a common device in integrated circuits. The dual polysilicon, or poly-poly, capacitor is used extensively in circuits designed in MOS processes. The main disadvantage of all integrated capacitors, including poly-poly capacitors, is a relatively small capacitance per area that requires large expensive devices for even modest capacitance values. An additional problem of dual plate, poly-poly capacitor structures is an unwanted parasitic capacitance between the lower poly plate and the underlying silicon substrate that can affect circuit performance and couple noise to and from the substrate. It is well known that these effects may be minimized by placing an electrically charged well beneath the capacitor structure. It is also well known that the well can be a source of noise for the biasing source unless a series impedance is placed between the well and the voltage source. This technique requires a large value resistance to function effectively, which in turn requires a large amount of die area devoted to the biasing resistor.

SUMMARY OF THE INVENTION

The present invention utilizes a small MOS transistor to replace the large resistor utilized in conventional dual plate capacitor designs, thus saving considerable die area.

More specifically, an integrated dual-plate capacitor structure in accordance with the present invention includes a semiconductor substrate having a first conductivity type and having a well region having a second conductivity type opposite the first conductivity type formed therein. An upper conductive plate and a lower conductive plate separated by a first layer of dielectric material are formed over the well region. The lower capacitor plate is separated from the upper surface of the well region by a second layer of dielectric material. A MOS transistor is formed in the semiconductor substrate. The MOS transistor includes space-apart source and drain regions of the second conductivity type that define a substrate channel region therebetween. A conductive gate is formed above the channel region and is separated therefrom by a layer of intervening dielectric material. The source region and the gate of the MOS transistor are connected to receive a bias voltage. The drain region of the MOS transistor is electrically connected to the well region.

In an alternative embodiment of the invention, the drain of the MOS transistor is incorporated into the well region of the capacitor structure.

The features and advantages of the present invention will be more fully appreciated upon consideration of the following detailed description of the invention and the accompanying drawings, which set forth an illustrative embodiment in which the principles of the invention are utilized.

DETAILED DESCRIPTION OF THE INVENTION

Figure 1:
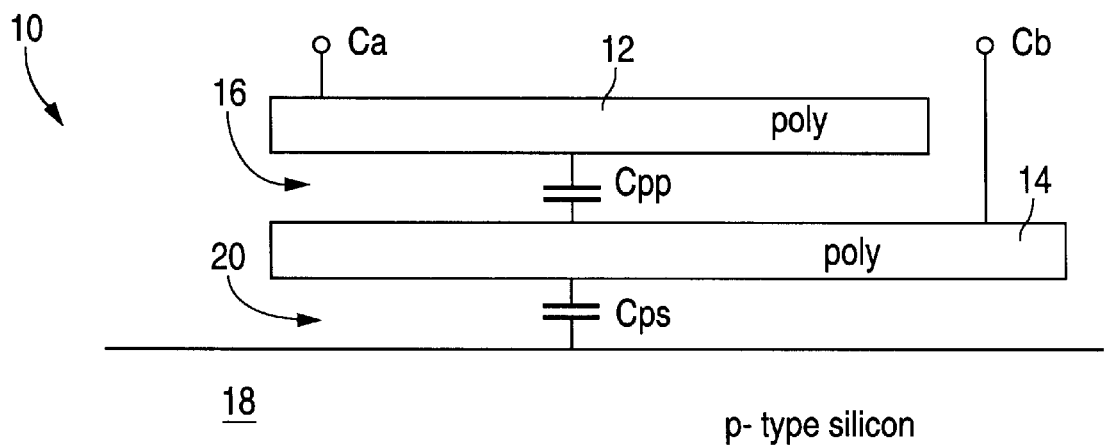
FIG. 1 is a schematic drawing illustrating a poly-poly capacitor structure.

FIG. 1 shows a conventional poly-poly capacitor 10 that includes two overlapping polysilicon plates, i.e. upper poly plate 12 and lower poly plate 14, separated by a layer dielectric material 16, typically silicon dioxide. The lower poly plate 14 is separated from an underlying silicon substrate 18 by a layer of dielectric material 20, also typically silicon dioxide. A p-type silicon substrate 18 process is described herein, but those skilled in the art will appreciate that the circuit structures and the inventive concepts presented herein are equally applicable to n-substrate processes.

Capacitor Cpp is the capacitance between the top poly plate 12 and the bottom poly plate 14. The bottom poly plate 14 forms a parasitic device Cps with the silicon substrate 18 lying below the oxide 20. The value Cps of the parasitic capacitance is typically a small, though not negligible, fraction of the capacitance Cpp seen between the upper and lower poly plates 12, 14. This polysilicon structure will couple signals present on the bottom plate 14 to and from the substrate 18.

Figure 2:
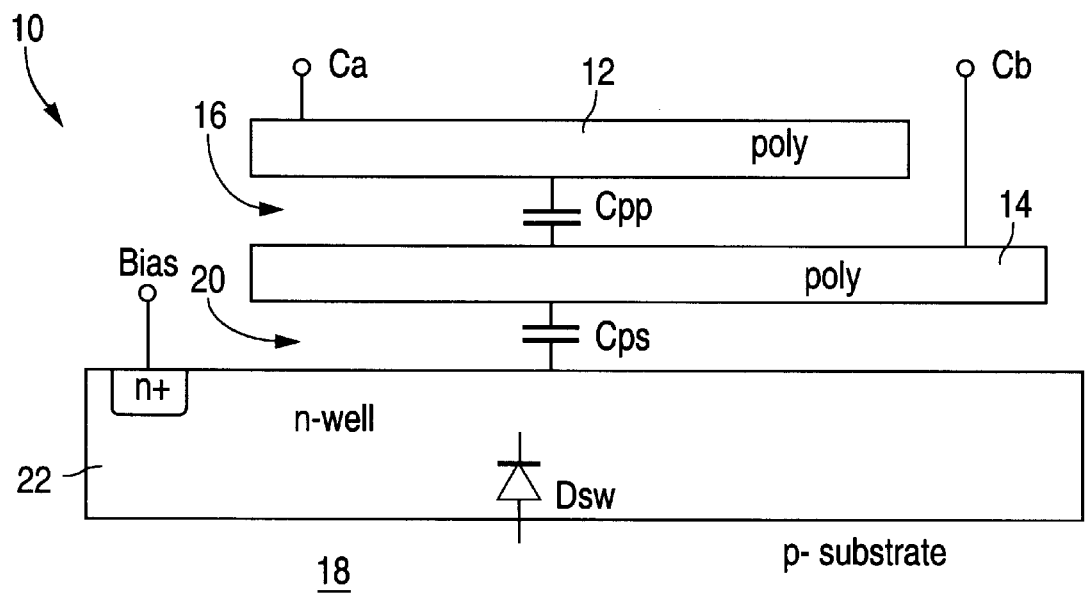
FIG. 2 is a schematic drawing illustrating a poly-poly capacitor structure with an electrically charged well formed beneath the capacitor structure.

As stated above, the addition of an electrically charged well 22 beneath the capacitor 10, as shown in FIG. 2, prevents the coupling of signals to the substrate 18 and reduces the effective value of the parasitic capacitance Cps. As shown in FIG. 2, this well 22 must be reverse-biased in order to create a depletion region around the well-substrate junction.

The addition of the well 22 reduces the parasitic coupling to the substrate 18, but it also introduces a new source of noise. The voltage of the well 22 cannot change in response to a change in the bias voltage source unless a flow of charge in or out of the well 22 takes place. This flow of charge, or current, is another source of noise in the chip.

Figure 3:
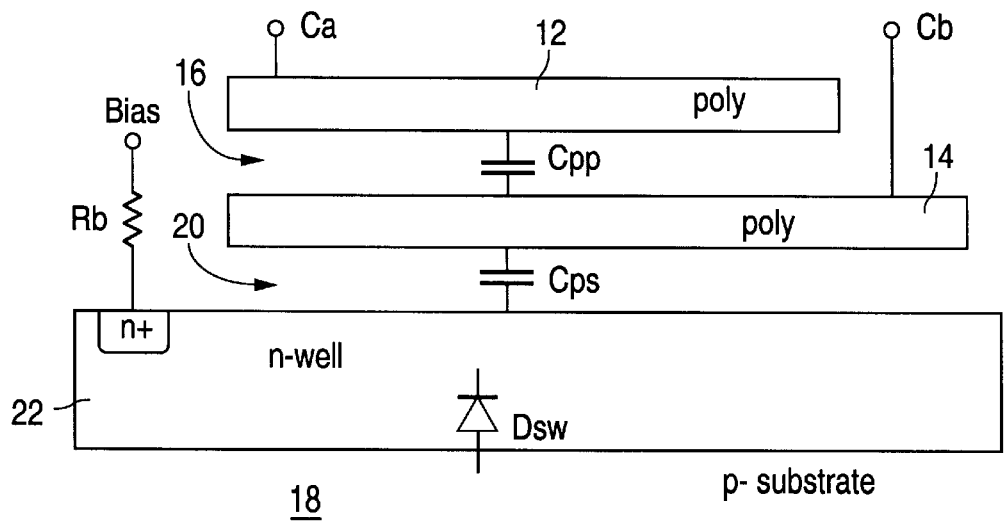
FIG. 3 is a schematic drawing illustration the FIG. 2 structure with the addition of a series resistance between the well and the voltage source.

As shown in FIG. 3, the addition of a series resistance Rb between the well 22 and the bias voltage source minimizes the magnitude of the current in or out of the well 22. The resistor Rb and the well 22 act as a low-pass RC filter and effectively slow down any voltage transient generated by the voltage source. The amount of current flowing in or out of the well 22 is simply the product of the well's capacitance and the amount of change of voltage divided by the transition time. However, as stated above, the size of the resistor Rb is a problem because a large resistor value is required for this technique to be effective.

Figure 4:
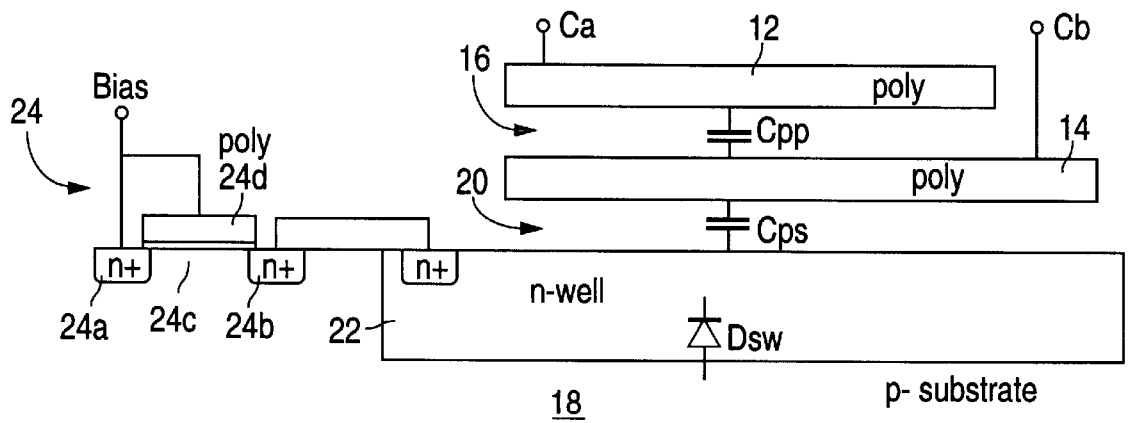
FIG. 4 is a schematic drawing illustrating a dual capacitor structure in accordance with the present invention.

In accordance with the present invention, the resistor Rb is be replaced by a diode-connected MOS transistor 24, as shown in FIG. 4. The output resistance of the transistor 24 is quite high and can be readily increased since the resistance is proportional to the length L to width (W) ratio (L/W) of the transistor 24. On a standard CMOS process, a transistor 24 with minimum width (W) and a length (L) of ten times the width will have an output resistance of several hundred kilohms while it is conducting. Once the well 22 is charged, transistor 24 will not conduct, effectively isolating the well 22 from the bias supply. This transistor 24 is many times smaller than an equivalent size resistor. The optimum size of the transistor 24 will depend on the size of the well 22 and the amount of peak current acceptable in the application. As shown in FIG. 4, the transistor 24 includes an n+source region 24a and an n+drain region 24b separated by a p-type substrate channel region 24c; a polysilicon gate 24d overlies the channel region 24c and is separated therefrom by gate dielectric, typically silicon dioxide.

Figure 5:
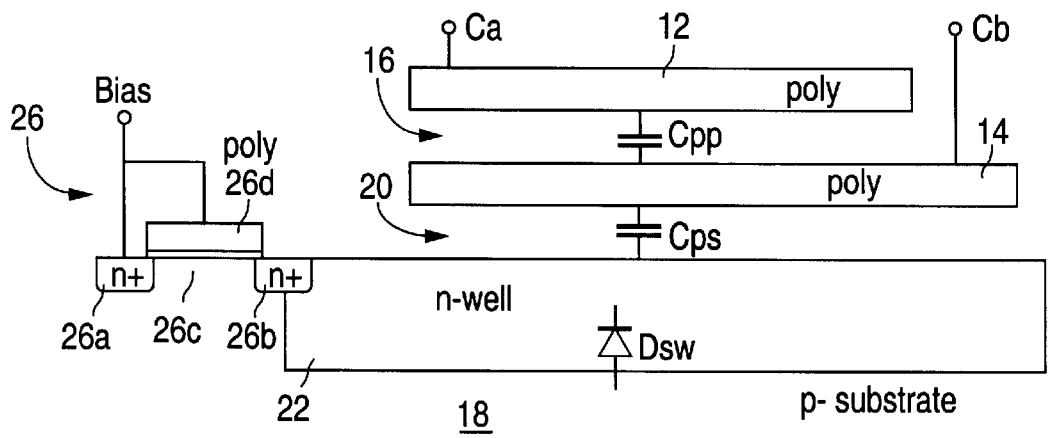
FIG. 5 is a schematic drawing illustrating an alternate embodiment of a dual plate capacitor structure in accordance with the present invention.

As shown in FIG. 5, die area of the FIG. 4 structure can be minimized further if the drain of the MOS transistor is incorporated into the well 22 of the capacitor 10. FIG. 5, shows a MOS transistor 26 that includes an n+source region 26a and an n+drain region 26b separated by a p-type substrate channel region 26c; a polysilicon gate 26d overlies the channel region 26c and is separated therefrom by gate dielectric, typically silicon dioxide.

Figure 6:
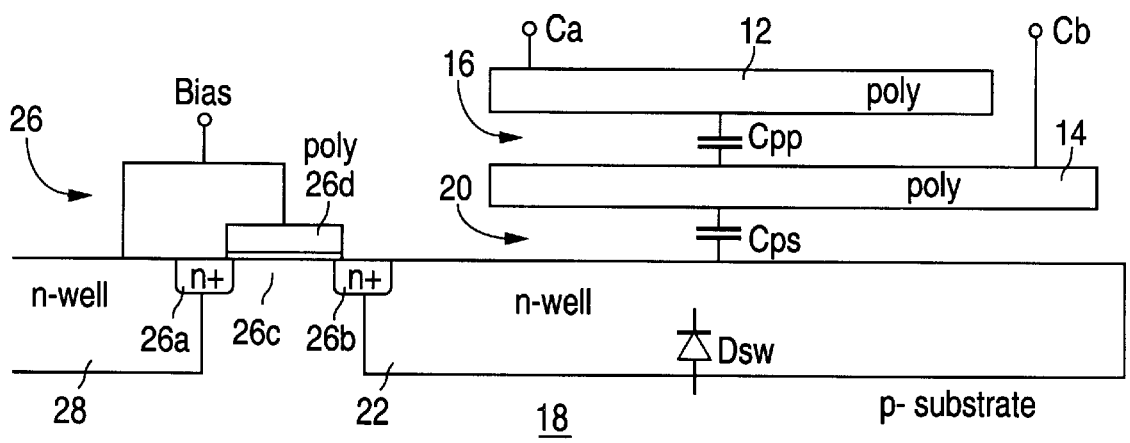
FIG. 6 is a schematic drawing illustrating a second alternate embodiment of a dual plate capacitor structure in accordance with the present invention.

As shown in FIG. 6, a second well 28 is added to the source side of transistor 26 in the FIG. 5 structure; the n-well 28 overlaps the n+source 26a in a manner similar to the overlap of drain region 26b by well 22. The source contact to the Bias supply is through the n-well, as shown in FIG. 6.

It is noted that, in each of FIGS. 4, 5 and 6, the upper capacitor plate is shown as being one distance from the active surface of the silicon, the lower capacitor plate is shown as being another distance from the active surface of the silicon, and the gate of the transistor (transistor 24 in FIG. 4 and transistor 26 in FIGS. 5 and 6) is shown as being yet another distance from the active surface of the silicon, suggesting that the structure in each case uses three layers of polysilicon. In fact, although the invention should not be so limited, the preferred embodiment uses only two layers of polysilicon and the poly for the gate of transistor is at the same distance from the active surface of the silicon as either the upper or lower plate of the capacitor. Either poly layer is acceptable for the gate of the transistor, the preference being dependent upon the particular application, the issues being high-voltage versus low-voltage operation and the location of the parasitic capacitance from the transistor gate.

The foregoing demonstrates the use of a small MOS transistor to replace the large resistor commonly found in conjunction with the isolating well of poly-poly capacitors. The transistor can be merged with the well's implant for further area reduction. This technique can extend to other parallel plate capacitor structures that employ an underlying well for either noise protection or circuit efficiency.

It should be recognized that a number of variations of the above-identified embodiments of the invention would be obvious to one of skill in the art in view of the foregoing description. Accordingly, although specific embodiments and methods of the present invention are shown and described herein, this invention is not to be limited by the specific embodiments. Rather, the scope of the invention is to be defined by the following claims and their equivalents.

What is claimed is:

1. An integrated dual-plate capacitor structure comprising:
    a semiconductor substrate having a first conductivity type;
    a first well region having a second conductivity type opposite the first conductivity type formed in the semiconductor substrate;
    an upper conductive plate and a lower conductive plate separated by a first layer of dielectric material and formed over the first well region, the lower conductive plate being separated from an upper surface of the first well region by a second layer of dielectric material; and
    a MOS transistor formed in the semiconductor substrate, the MOS transistor including space-apart source and drain regions having the second conductivity type and defining a substrate channel region having the first conductivity type therebetween and a conductive gate formed above the substrate channel region and separated therefrom by a layer of intervening dielectric material, the source region and the gate being connected to receive a bias voltage, the drain region being electrically connected to the first well region.

2. An integrated dual-plate capacitor structure as in claim 1, and wherein the upper conductive plate and the lower conductive plate comprise polysilicon and the first and second layers of dielectric material comprises silicon oxide.

3. An integrated dual-plate capacitor structure as in claim 1, and wherein the first conductivity type is p-type.

4. An integrated dual-plate capacitor structure as in claim 1, and wherein the drain region of the MOS transistor is incorporated into the first well region.

5. An integrated dual-plate capacitor as in claim 4, and further comprising:
    a second well region having the second conductivity type formed in the semiconductor substrate, the second well region being spaced apart from the first well region,
    and wherein the source region is electrically connected to the second well region.

6. An integrated dual-plate capacitor structure as in claim 5, and wherein the source region is incorporated into the second well region.

7. A method of forming an integrated dual-plate capacitor structure comprising:
    providing a semiconductor substrate having a first conductivity type;
    forming a first well region having a second conductivity type opposite the first conductivity type in the semiconductor substrate;
    forming an upper conductive plate and the lower conductive plate separated by a first layer of dielectric material over the first well region, the lower conductive plate being separated from an supper surface of the first well region by a second layer of dielectric material; and
    forming a MOS transistor in the semiconductor substrate, the MOS transistor including spaced-apart source and drain regions of the second conductivity type defining a substrate channel region having a first conductivity type therebetween, the MOS transistor further including a conductive gate formed above the channel region and separated therefrom by a layer of intervening dielectric material, the source region and the gate being connected to receive a bias voltage, the drain region being connected to the first well region.

8. A method as in claim 7, and wherein the first conductivity type is p-type.

9. A method as in claim 7, and wherein the upper conductive plate and the lower conductive plate comprise polysilicon and the first and second layers of dielectric material comprise silicon dioxide.

10. A method as in claim 7, and wherein the drain region of the MOS transistor is incorporated into the first well region.

11. A method as in claim 10, and wherein the step of forming a first well region includes forming a second well region in the semiconductor substrate, the second well region having the second conductivity type and being spaced-apart from the first well region, and the step of forming a MOS transistor includes forming the source region to be electrically connected to the second well region.

12. A method as in claim 11, and wherein the source region is incorporated into the second well region.

* * * * *